United States Patent
Feldtkeller (10) Patent No.: US 7,274,225 B2
(45) Date of Patent: Sep. 25, 2007

(54) METHOD FOR DRIVING A SEMICONDUCTOR SWITCHING ELEMENT IN A HALF-BRIDGE AND CIRCUIT ARRANGEMENT HAVING A HALF-BRIDGE

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 70 days.

(21) Appl. No.: 11/187,614

(22) Filed: Jul. 22, 2005

(65) Prior Publication Data

US 2006/0022346 A1 Feb. 2, 2006

(30) Foreign Application Priority Data

Jul. 22, 2004 (DE) .................. 10 2004 035 604

(51) Int. Cl.
*H03B 1/00* (2006.01)
(52) U.S. Cl. ....................... 327/112; 327/588
(58) Field of Classification Search ................ 327/110, 327/112, 427, 588
See application file for complete search history.

(56) References Cited

U.S. PATENT DOCUMENTS

| | | | |
|---|---|---|---|
| 4,027,152 A | 5/1977 | Brown et al. | |
| 4,667,144 A * | 5/1987 | Jones et al. | .................. 323/271 |
| 5,596,466 A | 1/1997 | Ochi | |
| 6,262,600 B1 | 7/2001 | Haigh et al. | |
| 6,396,250 B1 * | 5/2002 | Bridge | ........................ 323/283 |
| 6,538,481 B1 * | 3/2003 | Suetsugu | ..................... 327/109 |
| 6,822,401 B2 * | 11/2004 | Borella et al. | ............... 315/291 |
| 7,091,752 B2 * | 8/2006 | Balakrishnan | ............... 327/108 |
| 2004/0005009 A1 | 1/2004 | Taghizadeh-Kaschani | |
| 2004/0102164 A1 | 5/2004 | Taghizadeh-Kaschani | |

FOREIGN PATENT DOCUMENTS

| | | |
|---|---|---|
| DE | 196 00 807 A1 | 8/1996 |
| DE | 102 29 860 A1 | 1/2004 |
| DE | 102 44 186 A1 | 4/2004 |

* cited by examiner

*Primary Examiner*—Jeffrey Zweizig
(74) *Attorney, Agent, or Firm*—Maginot, Moore & Beck (57) ABSTRACT

A method and related apparatus drives a first semiconductor switching element, the load path of which is connected in series with a load path of a second semiconductor switching element in a half-bridge circuit and which is driven in the on state or in the off state according to switching signals transmitted via a transmission channel. The method includes detection of a load current through the half-bridge circuit, and repetition of the previous switching signal if the load current exceeds a predetermined maximum threshold value.

21 Claims, 6 Drawing Sheets

FIG 1

PRIOR ART

METHOD FOR DRIVING A SEMICONDUCTOR SWITCHING ELEMENT IN A HALF-BRIDGE AND CIRCUIT ARRANGEMENT HAVING A HALF-BRIDGE

Method for driving a semiconductor switching element in a half-bridge and circuit arrangement having a half-bridge

1. Field of the Invention

The present invention relates to a method for driving a semiconductor switching element in a half-bridge and a circuit arrangement having a half-bridge. The invention relates in particular to a method for driving a semiconductor switching element in a half-bridge to which switching signals are fed via a transmission path with a potential barrier.

2. Background

Figure 1:
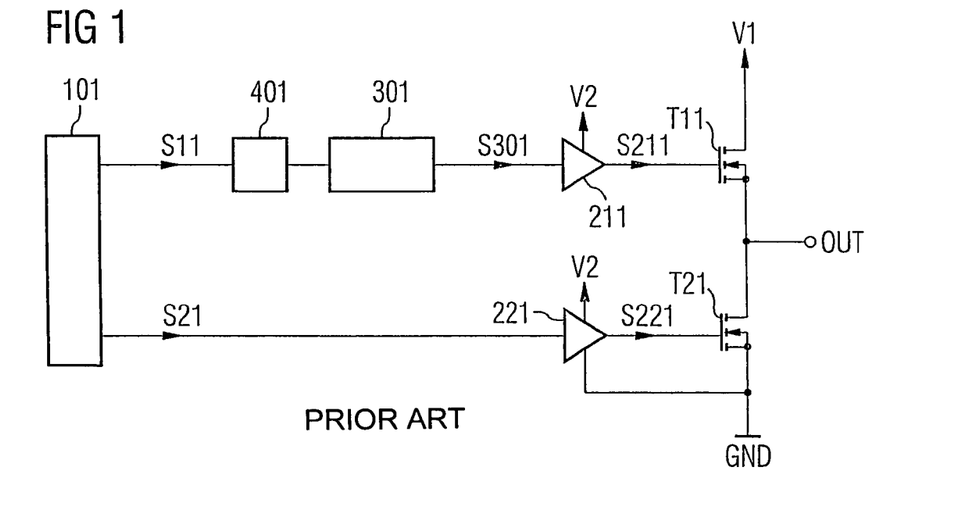
FIG. 1 shows a circuit arrangement having a half-bridge circuit according to the prior art.

FIG. 1 shows a circuit arrangement having such a half-bridge circuit. The half-bridge circuit comprises two semiconductor switching elements T11, T21 of the same conduction type, the load paths of which are connected in series between terminals for a supply voltage V1, GND. An output OUT of the half-bridge circuit is formed by a node common to the load paths of the semiconductor switching elements T11, T21. The semiconductor switching elements T11, T21 are driven in the on state or in the off state according to drive signals S11, S21 generated by a control circuit 101.

A transmission path 301 with a potential barrier is connected between the control circuit 101 and the first semiconductor switching element T11. In order that said first semiconductor switching element T11, designed as an n-channel MOSFET, is driven in the on state, a potential is required at the drive terminal of said element which is greater than the supply potential V1 serving to supply a load that can be connected to the output terminal OUT. In order to decouple this high potential V1, which may assume values of up to 400V, by way of example, for driving fluorescent lamps, from the logic potential of the control circuit 101, the transmission path 301 with the potential barrier is present. The said potential barrier may contain an optocoupler or a transformer, by way of example, in a sufficiently known manner.

For the signal transmission via such channels, a differential transmission method is utilized, for example, in which, in order to transmit the information contained in a two-valued signal, signal pulses are transmitted at the instants at which the two-valued signal has edges. In order to distinguish between rising and falling edges, the transmitted signal pulses may have different amplitudes or signs, or the signal pulses for rising and falling edges may be transmitted via different channels. The recovery of the two-valued signal from the transmitted pulses takes place at the end of the transmission channel by means of a suitable detection and demodulation circuit.

In the circuit in accordance with FIG. 1, a pulse shaper 401 connected between the control circuit 101 and the transmission path 301 generates, from the drive signal S11, suitable signal pulses for transmission via the potential barrier in the transmission path 301, the transmitted signal pulses being detected at the end of the transmission path 301 and being converted back into a two-valued signal S301 suitable for driving the first semiconductor switching element T11. Said two-valued signal is converted by a first driver circuit 211 to levels that are suitable for driving the first semiconductor switching element T11.

It is not absolutely necessary for there to be any potential isolation between the control circuit 101 and the second semiconductor switching element T21 serving as low-side switch, so that the second drive signal S21 can be fed to the control terminal of the second semiconductor switching element T21 directly via a driver circuit 221.

In the case of a circuit arrangement of this type, there is the risk of disturbance signals, for example disturbance signals on account of electromagnetic interference, being coupled into the transmission path 301 which are identical in form and amplitude to a switch-on pulse transmitted for switching on the switching element T11 or a switch-off pulse transmitted for switching off the latter, and which may thus lead to an undesirable switching operation of the first semiconductor switching element T11.

In order to avoid such undesirable switching operations, U.S. Pat. No. 4,027,152 or U.S. Pat. No. 6,262,600 in each case discloses a differential signal transmission method in which edges of a signal to be transmitted are converted into signal pulses for the transmission, said signal pulses being periodically repeated in each case after a predetermined edge in order to be able to correct transmission errors caused by disturbance influences.

What is disadvantageous about this method is the comparatively high power consumption arising from the periodic repetition of the transmitted signal pulses.

Differential signal transmission methods are additionally disclosed in DE 102 44 186 A1 or DE 102 29 860 A1, which involve transmitting the temporal information about rising edges of a two-valued signal in the form of pulses via a first transmission channel and the information about falling edges of said signal in the form of pulses via a second transmission channel. In the case of this known method, both transmission channels are monitored for a disturbance signal detection in order, upon detection of a disturbance signal, to retransmit the useful signal pulse sent last.

SUMMARY

It is an aim of the present invention to provide a method for driving a semiconductor switching element in a half-bridge which is suitable for correcting erroneous switching states resulting from disturbance influences and which can be implemented simply and with a low outlay, and also to provide a circuit arrangement having a half-bridge circuit in which erroneous switching states of at least one of the semiconductor switching elements that are caused by disturbance influences can be corrected.

This aim is achieved by means of a method and by means of a circuit arrangement according to embodiments of the invention.

The method according to the invention for driving a first semiconductor switching element, the load path of which is connected in series with a load path of a second semiconductor switching element in a half-bridge circuit and which is driven in the on state or in the off state according to switching signals transmitted via a transmission channel, has the following method steps:

detection of a load current through the half-bridge circuit,
  repetition of a switching signal transmitted last if the load current exceeds a predetermined maximum threshold value.

In order to minimize the power loss, the driving of semiconductor switching elements in half-bridges is effected, in principle, in such a way that the two semiconductor switching elements never turn on simultaneously. In order nonetheless to be able to identify such switching states in which both semiconductor switching elements turn on simultaneously and which constitute an error case, it is known in principle, in half-bridge circuits, to detect the load current through the half-bridge and to compare it with a predetermined threshold value. The method according to the invention is now based upon the insight that particularly when one of the two semiconductor switching elements is driven via a transmission channel with a potential barrier, such an error state can arise if the switching state of said one semiconductor switching element has changed on account of a disturbance signal coupled into the transmission path. Therefore, in the case of the method, it is provided that, when such an error case occurs, the switching signal transmitted last via the transmission path is transmitted once again in order to reestablish the switching state of said one semiconductor switching element, prior to the occurrence of the disturbance signal, i.e. prior to the detection of a load current exceeding the maximum permissible value.

If, in the case of the method according to the invention, the load current through the half-bridge exceeds the maximum threshold value for a time duration longer than a predetermined time duration, then a permanent error is assumed. In the case of such a permanent error, either it is attempted to turn off both semiconductor switching elements or the voltage supply of the half-bridge circuit is interrupted in order to prevent more extensive damage.

In the case of the method according to the invention, a repeated transmission of switching signals via the transmission path is effected only upon detection of an error which is assumed when both semiconductor switching elements turn on simultaneously. Such an error, as explained, can be detected in a simple manner by monitoring the load current through the half-bridge circuit. Load current monitoring devices are usually provided anyway in the case of half-bridge circuits in order to be able to identify short circuits at the load end and to implement suitable measures, so that, for the method according to the invention, it is possible to have recourse to an error signal or overcurrent signal which is present anyway and which is utilized in a suitable manner for the repeated transmission of a switching signal.

The circuit arrangement according to the invention comprises:
- a half-bridge circuit with a first semiconductor switching unit, which has a first semiconductor switching element, and a second semiconductor switching unit, which has a second semiconductor switching element, load paths of the first and second semiconductor switching elements being connected in series,
- a current measuring arrangement, which detects a load current through the half-bridge and which provides an overcurrent signal indicating an overload if the load current lies above a predetermined maximum threshold value,
- a switching signal generating circuit, which generates first switching signals, according to which the first semiconductor switching element turns on or turns off, for the first semiconductor switching unit, to which the overcurrent signal is fed and which is designed to repeat a switching signal generated last if the overcurrent signal indicates an overload.

The present invention is explained in more detail below using exemplary embodiments with reference to figures.

DETAILED DESCRIPTION

In the figures, unless specified otherwise, identical reference symbols designate identical circuit components and signals with the same meaning.

Figure 2:
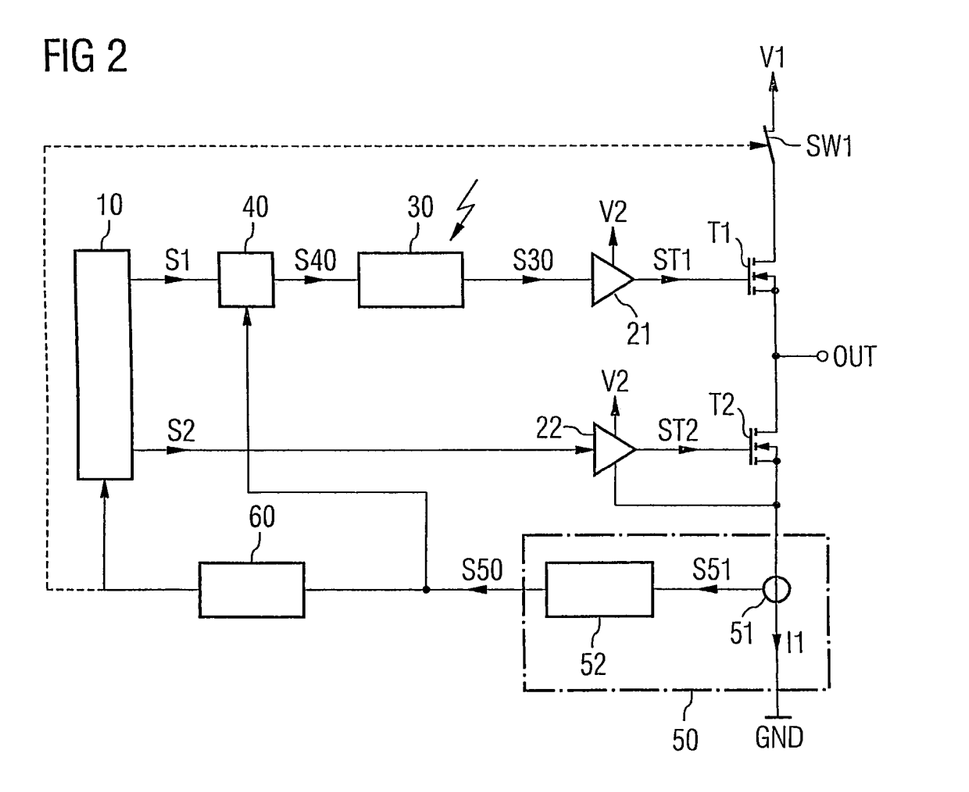
FIG. 2 shows a circuit arrangement according to the invention having a half-bridge circuit, a current measuring arrangement for detecting a load current through the half-bridge circuit, a switching signal generating circuit and a transmission path connected between the switching signal generating circuit and a first semiconductor switching element of the half-bridge circuits.

The circuit arrangement in accordance with FIG. 2 comprises a half-bridge circuit having a first semiconductor switching unit T1, 21 and a second semiconductor switching unit T2, 22. The first semiconductor switching unit comprises a first semiconductor switching element T1 having a load path and a control terminal, upstream of which a driver circuit 21 is connected, and the second semiconductor switching unit comprises a second semiconductor switching element T2 having a load path and a control terminal, upstream of which a second driver circuit 22 is connected.

The load paths of the two semiconductor switching elements of the same conduction type are connected in series with one another, an output OUT of the half-bridge circuit being formed by a node common to the load paths of the two semiconductor switching elements T1, T2. The semiconductor switching elements T1, T2 are of the same conduction type and are designed as n-channel MOSFETs in the example.

The task of the driver circuits 21, 22 is to convert two-valued drive signals S30, S2 fed to the driver circuits 21, 22 to signals ST1, ST2 having drive levels that are suitable for driving the semiconductor switching elements T1, T2. For this purpose, driver potentials V2 are fed to the driver circuits. The first driver circuit 21 has for example a bootstrap circuit (not illustrated), which generates, from the driver potential V2 in conjunction with the potential at the output OUT, a drive potential for the first semiconductor switching element T1 that lies above the supply potential V1 in order to ensure that the first semiconductor switching element is driven in the on state even when the output OUT of the half-bridge is at supply potential V1.

A control circuit 10 generates first and second drive signals S1, S2 according to which the first and second semiconductor switching elements T1, T2 are to be driven in the on state. Said drive signals S1, S2 are in each case two-valued drive signals that optionally have a first drive level or a second drive level, in which case the respective semiconductor switching element is to be driven in the on state at one of said drive levels and in the off state at the other of said drive levels.

The drive signals S1, S2 are for example logic signals having levels of 0V and 3.3V or 5V, while the drive signals S21, S22 generated by the driver circuits 21, 22 for the semiconductor switching elements T1, T2 have a signal swing of 10V, by way of example. The second driver circuit 22, to which the second drive signal S2 is fed directly in the example, thus generates from the second drive signal S2, for example, a drive signal ST2 having a level of 0V in order to turn off the second semiconductor element T2, or 10V in order to drive the second semiconductor element T2 in the on state.

In order that the high drive potential which is required for reliably driving the first semiconductor switching element T1 in the on state and which must lie above the supply potential V1 is decoupled in terms of potential from the logic supply potential of the control circuit 10, a transmission path 30 with a potential barrier is connected between the control circuit 10 and the first semiconductor switching unit 21, T1.

The transmission via said transmission path 30 is effected by means of a differential transmission method, i.e. edges of the two-valued first drive signal S1 are transmitted in the form of signal pulses having a predetermined form and a predetermined duration via the potential barrier, a two-valued drive signal S30 being generated again from the transmitted signal pulses at the end of the transmission path 30, said drive signal being fed to the second driver circuit 21.

For generating these signal pulses, which represent switch-on signals or switch-off signals, use is made of a switching signal generating circuit 40, to which the first drive signal S1 is fed and which generates switching signals S40 in the form of signal pulses from the first drive signal S1, which are transmitted via the transmission path 30 in order to drive the first semiconductor switching element T1 in the on state or in the off state.

The circuit arrangement additionally comprises a current measuring arrangement 50 having a current sensor 51, which detects a load current I1 through the half-bridge circuit, in the present case with respect to reference potential GND, and which generates a current measurement signal S51, which is fed to an evaluation circuit 52. The evaluation circuit 52 compares said current measurement signal S51 with a threshold value in a manner not specifically illustrated, in order to determine whether the load current I1 lies above a maximum permissible load current value. An overcurrent signal S50 is available at the output of said evaluation circuit 50, which signal assumes a predetermined level indicating an overload if the load current lies above the predetermined maximum threshold value. Said overcurrent signal S50 is fed to the control circuit 10 via a delay element 60 and is furthermore fed to the switching signal generating circuit 40 in an undelayed manner.

The switching signal generating circuit 40 is designed, upon detection of an overload situation, to generate anew the switching signal that was generated last and transmitted via the transmission path 30 and to transmit it via the transmission path 30, which, if appropriate, may lead to an ending of the overload situation, as is explained briefly below.

The maximum value with which the load current I1 is compared in the current measuring arrangement 50 is preferably chosen in such a way that said maximum value will now be exceeded when the first and second semiconductor switching elements T1 and T2 simultaneously turn on in an erroneous manner. Such an error situation may arise as explained below: It shall firstly be assumed that the second semiconductor switching element T2, driven by the second drive signal S2, firstly turns on properly and that the first semiconductor switching element T1 turns off properly after a predetermined edge of the first drive signal S1. Due to electromagnetic interference, disturbance pulses may then be coupled into the transmission path 30 (symbolized by a flash of lightning in FIG. 2), which, in an evaluation circuit (not illustrated in FIG. 2) at the end of the transmission path 30, are interpreted as a switch-on pulse by which the first semiconductor switching element T1 is switched on. If, after identification of the resultant overload situation, a renewed generation and transmission of the previously generated and sent switching (off) signal is brought about in a manner driven by the overcurrent signal S50, then the erroneous switching state of the first semiconductor switching element T1 is immediately corrected and the first semiconductor switching element T1 is turned off again.

Optionally, between the detection of the overload state and the initiation of a renewed switching signal transmission, it is possible to wait for a delay time to elapse in order to increase the probability that the disturbance pulses that brought about the erroneous switching state of the first semiconductor switching element T1 will have decayed again by the time the renewed transmission of the original switching signal takes place. The said delay time is preferably between 20 ns and 100 ns and is to be chosen in any event so as to preclude damage to the half-bridge circuits on account of the load current flowing within said delay time.

If the overload situation is still present after the delay time prescribed by the delay element 60, which delay time is longer than the optional delay time, then a permanent error is assumed in the half-bridge circuits, for example a permanent erroneous turn-on of a semiconductor switching element T1, T2 or a short circuit of the load. In this case, after said delay time has elapsed, the overcurrent signal S50 is fed to the control circuit 10 in order to drive both semiconductor switching elements T1, T2 in the off state and to prevent further driving in the on state. If an error is present which results in one of the semiconductor switching elements T1, T2 turning on permanently, then at least a short circuit of the supply voltage would be prevented by driving the other semiconductor switching element in the off state.

As an alternative, there is the possibility of interrupting the voltage supply of the half-bridge circuits T1, T2 by means of the delayed overcurrent signal S60 present at the output of the delay element. For this purpose, by way of example, a switch SW1 driven by said delayed overcurrent signal S60 is connected in series with the half-bridge circuit T1, T2.

Figure 3:
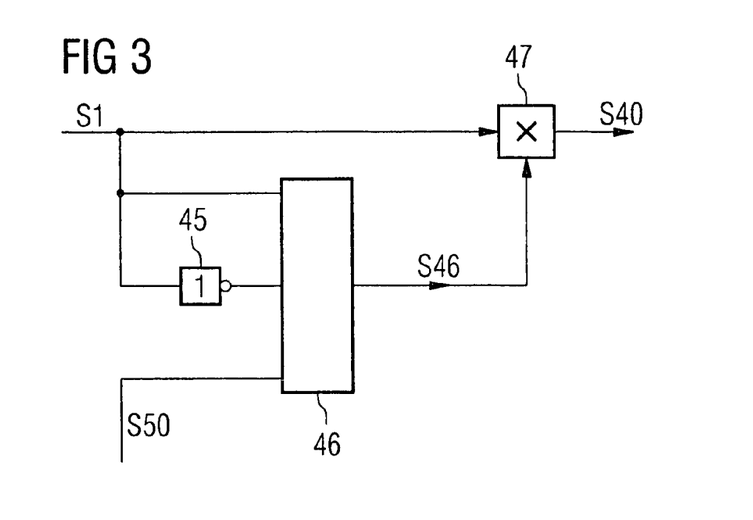
FIG. 3 shows a first exemplary embodiment of the signal generating circuit.

The construction and the functioning of a first exemplary embodiment of the switching signal generating circuit 40 are explained below with reference to FIGS. 3 and 4. Referring to FIG. 3, the switching signal generating circuit 40 comprises a pulse shaper 46, to which the first drive signal S1 is fed directly, to which the first drive signal S1 is fed in a manner inverted by means of an inverter 45, and to which the overcurrent signal S50 is fed. Said pulse shaper 46 is designed to provide a signal pulse having a predetermined form and duration in each case at the instants at which the first drive signal S1 has a rising edge, at which the inverted first drive signal S1 has a rising edge (which corresponds to a falling edge of the first drive signal S1) and at which the overcurrent signal S50 has a rising edge. It is assumed for this example that a rising edge of the overcurrent signal S50 indicates an overload situation.

Figure 4:
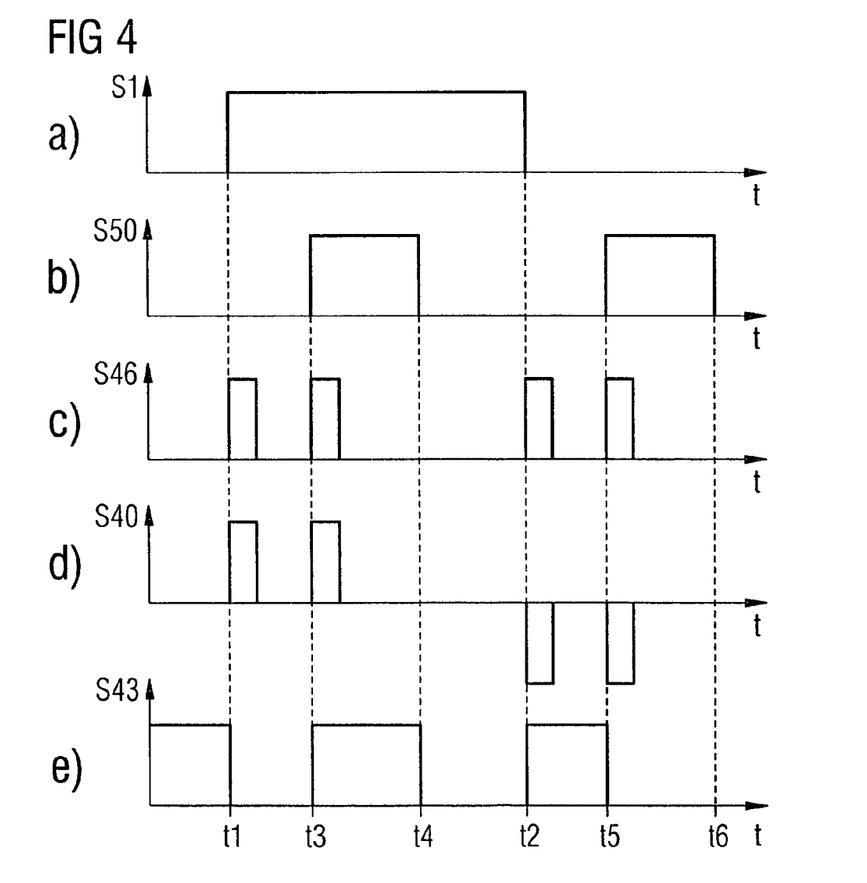
FIG. 4 illustrates temporal profiles of the signals occurring in the signal generating circuit in accordance with FIG. 3.

FIG. 4c shows the temporal profile of the signal S46 present at the output of the pulse shaper 46 for a first drive signal S1 which has a rising edge at an instant t1 and a falling edge at an instant t2, and also for the overcurrent signal S50 in accordance with FIG. 4b, which has rising edges at instants t3 and t5 and falling edges at instants t4 and t6. The output signal S46 of the pulse shaper 46 in each case has signal pulses at the instants at which the first drive signal S1 has a rising or a falling edge, which prescribe switch-on and switch-off instants of the first semiconductor switching element T1, and at which the overcurrent signal S50 has a rising edge.

The switching signal generating circuit 40 illustrated supports a transmission method in which positive signal pulses are transmitted as switch-on signals upon rising edges of the first drive signal S1 and negative signal pulses are transmitted as switch-off signals upon falling edges of the first drive signal S1. For this purpose, the output signal S46 of the pulse shaper 46 is fed to an output stage 47, which fulfills the function of a controlled inverter or of a multiplier and which forwards, in a manner dependent on the first drive signal S1, the pulse shaper output signal S46 to the output as switching signal S40 in unchanged fashion or in a manner multiplied by a factor of −1. At a high level of the first drive signal S1, at which the first semiconductor switching element T1 is intended to turn on, a first positive switch-on pulse is transmitted at the instant t1. Such a positive switch-on pulse is transmitted in a repeated manner at the instant t3 as a repetition pulse after the detection of the overload case. A negative switch-off pulse is transmitted at the instant t2, and is transmitted anew at the instant t5 after the detection of the overload case.

Figure 5:
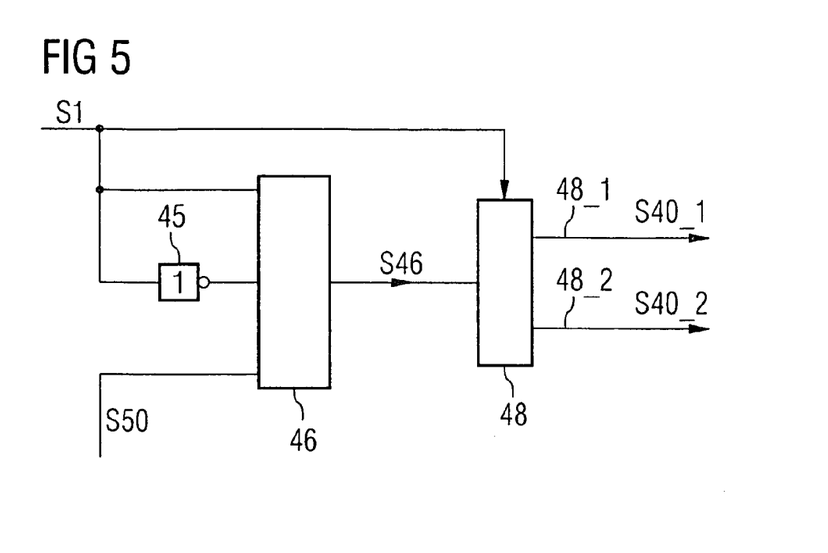
FIG. 5 shows a second exemplary embodiment of the switching signal generating circuit.
Figure 6:
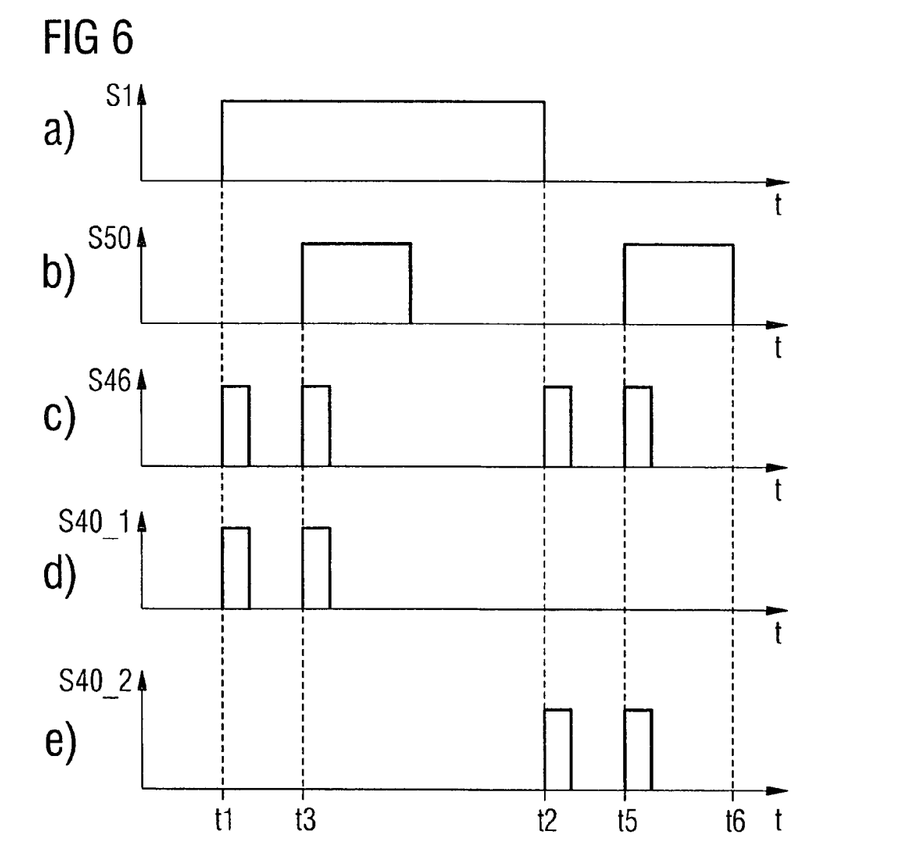
FIG. 6 shows by way of example temporal profiles of the signals occurring in the switching signal generating circuit in accordance with FIG. 5.

FIG. 5 shows a second exemplary embodiment of the switching signal generating circuit, this switching signal generating circuit supporting a differential transmission method in which switch-on pulses and switch-off pulses for the first semiconductor switching element T1 (FIG. 2) are transmitted via different transmission channels of the transmission path 30. As output stage 48, this switching signal generating circuit comprises a multiplexer 48 which, according to the first drive signal S1, provides the output signal S46 of the pulse shaper 46 as first switching signal S40_1 at a first output 48_1 or as second switching signal S40_2 at a second output 48_2. FIGS. 6d and 6e show the temporal profiles of these first switching signals S40_1 and S40_2 for the first drive signal S1 in FIG. 6a, the overload signal in FIG. 6b and the output signal S46 of the pulse shaper that results from the first drive signal S1 and the overload signal S50 in FIG. 6c. As illustrated, switch-on pulses are transmitted upon a rising edge of the first drive signal S1 and as a repetition pulse at a high level of the first drive signal S1 and, upon detection of the overload case, as positive signal pulses via the first transmission channel, and switch-off pulses are transmitted after a falling edge of the first drive signal S1 and as a repetition pulse at a low level of the first drive signal S1 and, after detection of an overload case, as positive signal pulses via the second transmission channel.

Figure 7:
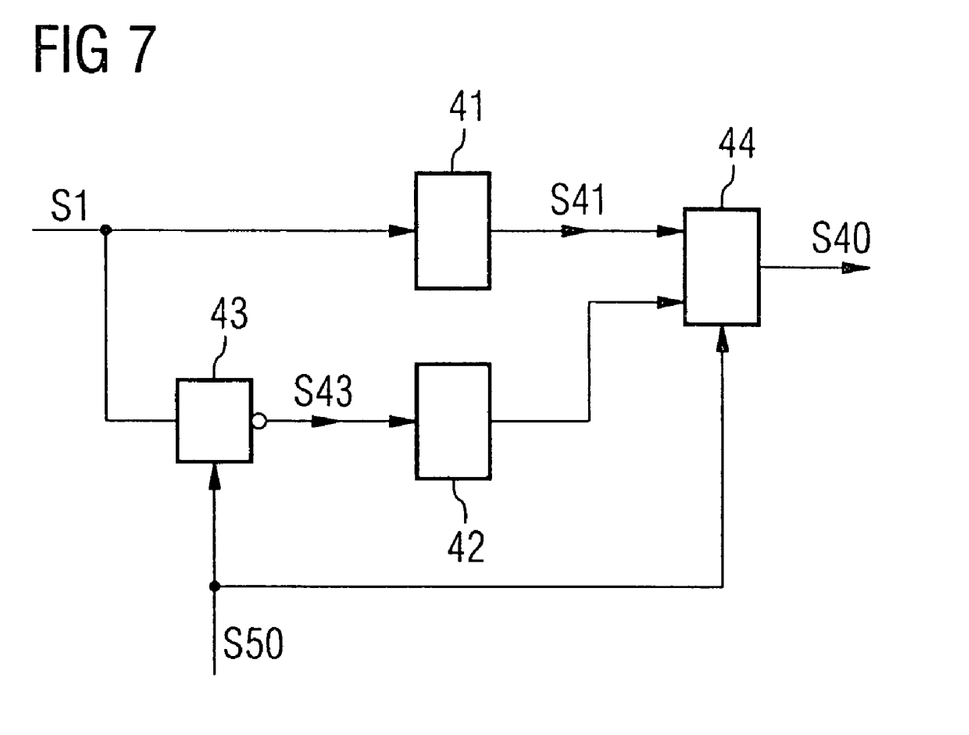
FIG. 7 shows a third exemplary embodiment of a switching signal generating circuit.

FIG. 7 shows a third exemplary embodiment of the switching signal generating circuit. This switching signal generating circuit comprises two pulse shapers, the first drive signal S1 being fed to the first pulse shaper 41 and the output signal of a logic gate 43 being fed to the second pulse shaper 42. Said logic gate is fed the first drive signal S1 and also the overload signal S50 and is embodied as an XOR-Gate with an inverting output. Output signals S41, S42 of said pulse shapers 41, 42 are fed to a multiplexer 44, which is driven according to the overload signal S50.

In the example, the pulse shapers 41, 42 are configured such that they generate a positive signal pulse upon a rising edge of the respective input signal S1, S43 and a negative signal pulse upon a falling edge of the respective input signal.

The multiplexer 44 passes the output signal S41 of the first pulse shaper 41 as switching signal S40 to the output if the overload signal S50 does not indicate an overload situation, if the overload signal S50 has a low level, and in the other case passes on the output signal S42 of the second pulse shaper 42 as switching signal S40 to the output.

Figure 8:
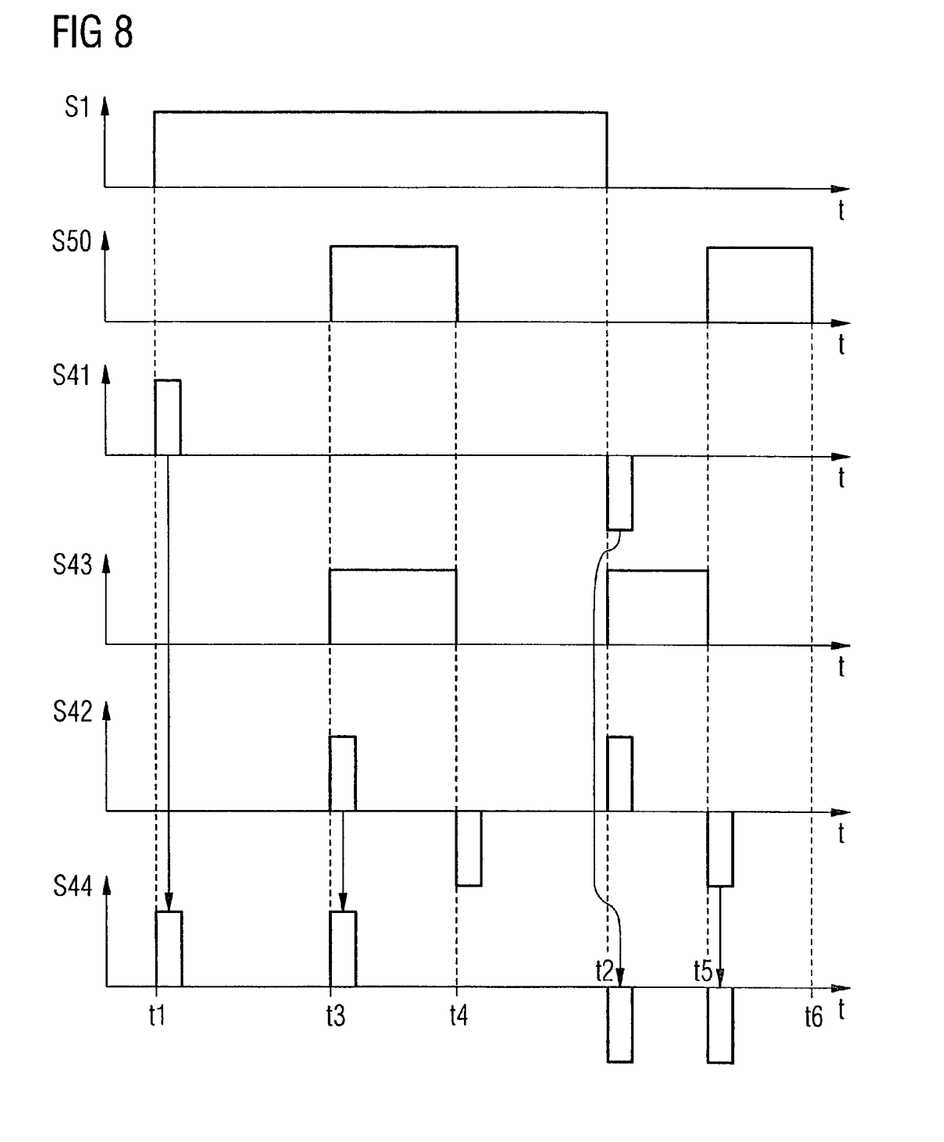
FIG. 8 shows by way of example temporal profiles of the signals occurring in the switching signal generating circuits in accordance with FIG. 7.

FIG. 8 illustrates the functioning of the switching signal generating circuit in accordance with FIG. 7 on the basis of exemplary temporal profiles of the signals occurring in the switching signal generating circuit. The temporal profile of the first drive signal S1 and also of the overload signal S50 that has already been used for the previous examples is assumed for the example. At the instant t1, after a rising edge of the first drive signal S1, the output signal S41 of the first pulse shaper has a positive signal pulse, which is passed on as output signal S40 to the output by the multiplexer 44. At the instant t3, if the first drive signal S1 still has a high level, and the overload signal S50 has a rising edge, the output signal S43 of the logic gate likewise has a rising edge, which results in a positive signal pulse of the output signal S42 of the second pulse shaper 42, which is passed on as output signal S44 by the multiplexer 44 and which represents a repetition pulse.

A negative signal pulse in the output signal S42 of the second pulse shaper 42 at the instant t4 is not passed on by the multiplexer 44 since the overcurrent signal S50 has a low level again at this instant.

At the instant t2, if a falling edge of the first drive signal S1 is present and the overload signal has a low level, a positive signal pulse is generated by the first pulse shaper 41 and is passed on as output pulse by the multiplexer. At the instant t5, if the first drive signal S1 has a low level and the overload signal S50 has a rising edge, which results in a falling edge of the logic gate output signal S43, the second pulse shaper generates a negative pulse, which is passed on as output pulse by the multiplexer owing to the high level of the overload signal S50 and which represents a repetition pulse.

Figure 9:
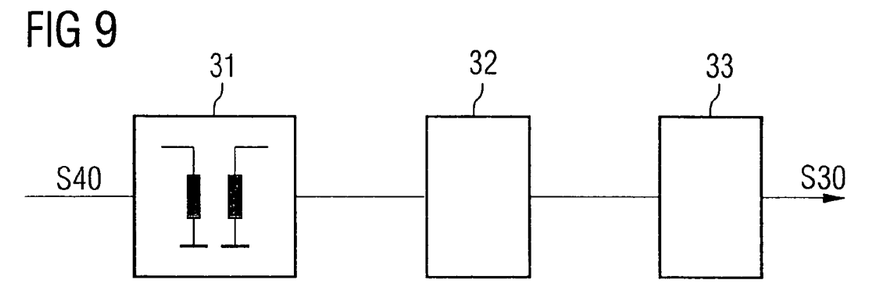
FIG. 9 shows a one-channel transmission path with a potential barrier.
Figure 10:
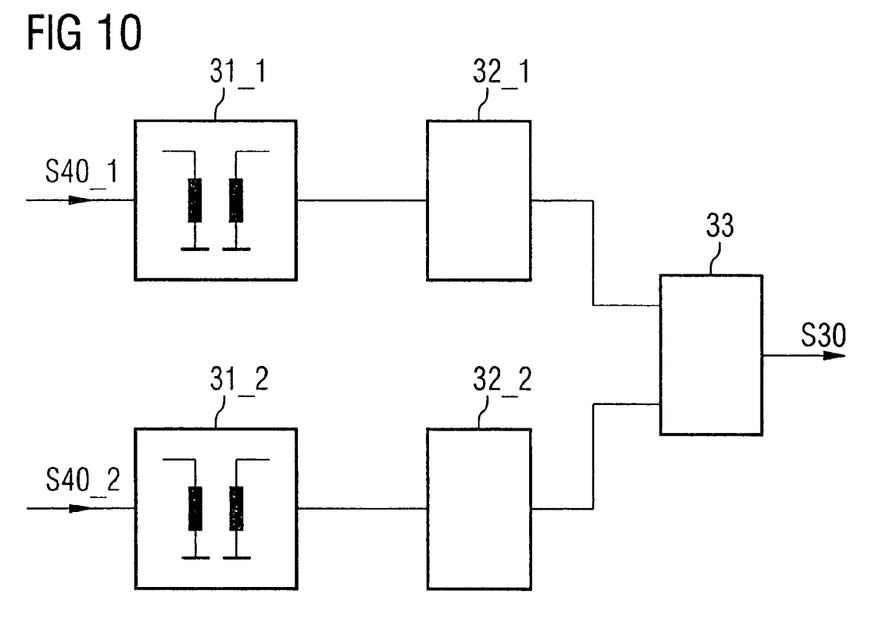
FIG. 10 shows a two-channel transmission path with a potential barrier.

Finally, FIGS. 9 and 10 show two exemplary realisations of transmission channels with potential barriers. FIG. 9 shows a one-channel variant having a transformer as potential barrier 31, to which transformer is fed the switching signal S40 of the switching signal generating circuit which has signal pulses. On that side of the transformer 31 which is remote from the switching signal generating circuit, that is to say on the receiver side, a detector circuit 32 is connected which detects transmitted signal pulses and, if appropriate, converts them to a level that is suitable for a processing circuit connected downstream. Said processing circuit 33 converts the received signal pulses into the two-valued drive signal S30 for the first semiconductor switching element T1.

FIG. 10 shows a two-channel variant of the transmission path having two transformers 31_1, 31_2 as potential barriers, to each of which one of the pulsed switching signals S40_1, S40_2 are fed. On the receiver side, detector circuits 32_1, 32_2 are fed to the potential barriers 31_1, 31_2 and supply signal pulses corresponding to the received signal pulses to a processing circuit 33 which generates the two-valued drive signal S30. The processing circuit 33 is an RS flip-flop, for example, which is set by means of a received pulse via one transmission channel, for example the upper transmission channel 31_1, 32_1, and which is reset in the case of a received pulse via the lower transmission channel 31_2, 32_2.

LIST OF REFERENCE SYMBOLS

GND Reference Potential
I1 Load current
OUT Output terminal
SW1 Switch
S1, S2 Drive signals
S11, S21 Drive signals
S21, S22 Drive signals
S211, S221 Drive signals
S30 Drive signal
S40 Switching signal
S40_1, S40_2 Switching signals
S46 Output signal of the pulse shaper
S51 Current measurement signal
T1, T2 Semiconductor switching elements
T11, T21 Semiconductor switching elements
V1 Supply potential
V2 Supply potential of the driver circuit
10 Control circuit
30 Transmission path
31 Potential barrier, transformer
32 Detector circuit
33 Evaluation circuit
40 Switching signal generating circuit
21, 22 Driver circuits
43 XOR-Gate with inverting output
44 Multiplexer
45 Inverter
46 Pulse shaper
47 Output stage
48 Multiplexer
50 Current measuring arrangement
51 Current measuring element
52 Evaluation circuit
60 Delay element
31_1, 31_2 Potential barrier, transformer
32_1, 32_2 Detector circuit
41, 42 Pulse shaper
48_1, 48_2 Outputs of the multiplexer
101 Control circuit
301 Transmission path
401 Switching signal generating circuit
211, 221 Driver circuits

The invention claimed is:

1. A method for driving a first semiconductor switching element, a load path of the first semiconductor switching element connected in series with a load path of a second semiconductor switching element in a half-bridge circuit, the first semiconductor switching element driven in the on state or in the off state according to switching signals provided via a channel, the method comprising:
   a) applying a switching signal to the first semiconductor switching element, the first switching signal driving the first semiconductor switching element in one of an on state or an off state;
   b) detecting a load current through the half-bridge circuit;
   c) repeating the switching signal driving the first semiconductor switching element in the one of the on state or the off state if the load current exceeds a predetermined threshold value.

2. The method as claimed in claim 1, further comprising:
   d) driving the first semiconductor switching element in the off state if the load current exceeds the predetermined threshold value for longer than a predetermined time duration.

3. The method as claimed in claim 1, further comprising:
   d) generating first switching signals for the first semiconductor switching element and second switching signals for the second semiconductor switching element such that the first and second semiconductor switching elements turn on non-simultaneously in disturbance-free operation of the half-bridge circuit.

4. The method as claimed in claim 1, further comprising:
   d) providing switching signals through the channel.

5. The method as claimed in claim 4, wherein step d) further comprises passing the switching signals through a potential barrier in the channel.

6. The method as claimed in claim 4, wherein the switching signals are generated from a drive signal, the drive signal provided by a control circuit.

7. The method as claimed in claim 4, wherein step d) further comprises providing the switching signals in the form of signal pulses.

8. The method as claimed in claim 7, wherein the signal pulses have a first sign in order to drive the first semiconductor switching element in the on state and a second sign in order to drive the first semiconductor switching element in the off state.

9. The method as claimed in claim 7, wherein step d) further comprises transmitting the signal pulses via a first transmission channel in order to drive the first semiconductor switching element in the on state and via a second transmission channel in order to drive the first semiconductor switching element in the off state.

10. A circuit arrangement comprising:
    a half-bridge circuit including a first semiconductor switching unit and a second semiconductor switching unit, the first semiconductor switching unit including a first semiconductor switching element, the second semiconductor switching unit including a second semiconductor switching element, load paths of the first and second semiconductor switching elements being connected in series;
    a current measuring arrangement configured to detect a load current through the half-bridge circuit and which provides an overcurrent signal indicating an overload if the load current exceeds a predetermined threshold value; and
    a switching signal generating circuit configured to generate a first switching signal to control the first semiconductor switching element, the switching signal generating circuit operably coupled to receive the overcurrent signal and configured to repeat a most recently generated pulse of the first switching signal responsive to the overcurrent signal.

11. The circuit arrangement as claimed in claim 10, further comprising a control circuit configured to provide a first drive signal to the switching signal generating circuit, and to provide a second drive signal, and wherein:
    the switching signal generating circuit is operable to generate the first switching signal based on the first drive signal; and
    the second semiconductor switching element is controlled in dependence on the second drive signal.

12. The circuit arrangement as claimed in claim 10, further comprising a transmission path having at least one potential barrier, the transmission path connected between the switching signal generating circuit and the first semiconductor switching unit.

13. The circuit arrangement as claimed in one of claim 10, wherein the switching signal generating circuit is configured to generate the first switching signal as signal pulses.

14. The circuit arrangement as claimed in claim 13, wherein the switching signal generating circuit is further configured to generate the signal pulses such that the signal pulses have a first sign in order to drive the first semiconductor switching element in the on state, and have a second sign in order to drive the first semiconductor switching element in the off state.

15. The circuit arrangement as claimed in claim 12, wherein the transmission path includes two transmission channels coupled between the switching signal generating circuit and the first semiconductor switching unit, and wherein the switching signal generating circuit is configured to transmit a switching signal pulse via the first channel in order to drive the first semiconductor switching element in the on state and transmit a switching signal pulse via the second channel in order to drive the first semiconductor switching element in the off state.

16. The circuit arrangement as claimed in claim 10, wherein the first semiconductor switching unit further includes a first driver coupled to a control input of the first semiconductor switching element, and the second semiconductor switching unit includes a second driver coupled to a control input of the second semiconductor switching element.

17. The circuit arrangement of claim 10, wherein the switching signal generating circuit comprises:
  a pulse shaper configured to receive as input signals a first drive signal, an inverted first drive signal, and the overcurrent signal, the pulse shaper configured to generate a signal pulse corresponding to a predetermined edge of at least one of the input signals,
  an output stage operably coupled to receive the signal pulse and configured to process the signal pulse in dependence on the first drive signal, the output stage operably coupled to provide the processed signal pulse as the first switching signal.

18. The circuit arrangement as claimed in claim 17, wherein the output stage comprises a controlled inverter configured to selectively invert the signal pulse in a manner dependent on the first drive signal.

19. The circuit arrangement as claimed in claim 17, wherein the output stage comprises a multiplexer configured to provide the signal pulse to a first or second output of the switching signal generating circuit in a manner dependent on the drive signal.

20. The circuit arrangement of claim 10, wherein the switching signal generating circuit is further configured to generate the first switching signal such that the first switching signal includes a first pulse and a second pulse in sequence in the absence of an overcurrent signal, and such that the first switching signal includes the first pulse and a repeated first pulse prior to the second pulse load responsive to the overcurrent signal.

21. A circuit arrangement comprising:
  a first circuit including a first semiconductor switching unit and a second semiconductor switching unit, the first semiconductor switching unit including a first semiconductor switching element, the second semiconductor switching unit including a second semiconductor switching element, load paths of the first and second semiconductor switching elements being connected in series;
  a current measuring arrangement configured to detect a load current through a load path of the first circuit and which provides an overcurrent signal indicating an overload if the load current exceeds a predetermined threshold value;
  a switching signal generating circuit configured to generate a first switching signal to control the first semiconductor switching element, the switching signal generating circuit operably coupled to receive the overcurrent signal and configured to repeat a previously generated first switching signal responsive to the overcurrent signal; and
  a transmission path having at least one potential barrier, the transmission path connected between the switching signal generating circuit and the first semiconductor switching unit.

* * * * *